(12) United States Patent
Kordina et al.

(10) Patent No.: US 8,430,965 B2
(45) Date of Patent: Apr. 30, 2013

(54) EPITAXIAL GROWTH SYSTEM FOR FAST HEATING AND COOLING

(75) Inventors: Olof Claes Erik Kordina, Pittsburgh, PA (US); Rune Berge, Lund (SE)

(73) Assignee: Pronomic Industry AB (SE)

( * ) Notice: Subject to any disclaimer, the term of this patent is extended or adjusted under 35 U.S.C. 154(b) by 1389 days.

(21) Appl. No.: 12/029,833

(22) Filed: Feb. 12, 2008

(65) Prior Publication Data

US 2012/0153298 A1 Jun. 21, 2012

Related U.S. Application Data

(60) Provisional application No. 60/901,864, filed on Feb. 16, 2007.

(51) Int. Cl.
*C23C 16/00* (2006.01)
*C23C 16/46* (2006.01)

(52) U.S. Cl.
USPC ............................. 118/724; 118/715; 118/725

(58) Field of Classification Search .................. 118/715, 118/724, 725
See application file for complete search history.

(56) References Cited

U.S. PATENT DOCUMENTS

| | | | | |
|---|---|---|---|---|
| 2,817,311 A | * | 12/1957 | Nack .............................. | 118/725 |
| 3,651,240 A | * | 3/1972 | Kirkpatrick ................ | 219/78.02 |
| 4,747,367 A | * | 5/1988 | Posa ............................ | 118/715 |
| 4,753,192 A | * | 6/1988 | Goldsmith et al. ........... | 118/725 |
| 4,914,276 A | * | 4/1990 | Blair ............................ | 219/390 |
| 5,506,389 A | * | 4/1996 | Hidano et al. ................ | 219/390 |
| 7,048,802 B2 | * | 5/2006 | Kaeppeler et al. ........... | 118/725 |
| 7,247,513 B2 | * | 7/2007 | Kordina ......................... | 438/105 |
| 2003/0186517 A1 | * | 10/2003 | Takagi ......................... | 438/478 |
| 2004/0007187 A1 | * | 1/2004 | Kappeler et al. ............. | 118/730 |
| 2004/0020436 A1 | * | 2/2004 | Kaeppeler et al. ........... | 118/724 |
| 2007/0259532 A1 | * | 11/2007 | Suzaki et al. ................ | 438/758 |
| 2009/0239386 A1 | * | 9/2009 | Suzaki et al. ................ | 438/758 |
| 2010/0051597 A1 | * | 3/2010 | Morita et al. ................ | 219/201 |
| 2011/0217486 A1 | * | 9/2011 | Murai et al. .................. | 427/593 |
| 2012/0153298 A1 | * | 6/2012 | Kordina et al. ................ | 257/77 |

* cited by examiner

*Primary Examiner* — Jeffrie R Lund
(74) *Attorney, Agent, or Firm* — Shumaker, Loop & Kendrick, LLP

(57) ABSTRACT

A system for crystal growth having rapid heating and cooling. A fluid-cooling jacket having a reflective shield contained therein is disposed around a heating cylinder in which crystal growth takes place. A heating coil is disposed round the cooling jacket. The invention also includes a method of crystal growth and semiconductor devices formed using the inventive methods and systems.

7 Claims, 3 Drawing Sheets

EPITAXIAL GROWTH SYSTEM FOR FAST HEATING AND COOLING

This application is based on, and claims priority to, U.S. provisional application, Ser. No. 60/901,864, having a filing date of Feb. 16, 2007, entitled Epitaxial Growth System for Fast Heating and Cooling.

FIELD OF THE INVENTION

The invention relates a method and apparatus for crystal growth, particularly applicable to epitaxial growth of silicon carbide.

BACKGROUND OF THE INVENTION

Epitaxy at very high temperatures, such as silicon carbide (SiC) epitaxy which is conducted at around 1600° C., is very difficult to accomplish due to the erosion of the hot zone parts of the reactor and thermal losses due to radiation. The hot zone materials are usually made from coated graphite surrounded by thick insulation consisting of rigid graphite insulation or graphite felt insulation. The insulation generally increases the time necessary to heat up and cool down the system.

FIG. 1 is a section view of a portion of a prior art reactor showing a rectangular susceptor 102 surrounded by insulation 104. A quartz tube 106 surrounds rectangular susceptor 102. Quartz tube 106 is surrounded by heating coil 108. It is also suitable, and sometimes preferably to use a cylindrical susceptor within a cylindrical coil. Insulation 104 covers the front and back of susceptor 102 (not fully shown here). Due to the large distance from the susceptor to the coil and the large amount of insulation, this system is long in heat-up and cool-down time.

Susceptor 102 is heated by rf heating via coil 108 surrounding cylindrical quartz tube 106. Quartz tube 106 is usually not water cooled. This is an unfortunate choice of design as the distance to the coil is closest where the side walls (not shown) are. In order to improve the coupling of the coil to the graphite susceptor, the rectangular blocks are made thicker which increases the heat up and cool down time. Furthermore, the insulation is very thick on the top and bottom of the susceptor which also increases the cool down time. Finally, the temperature uniformity is not very good in such a configuration and the required power is high.

The insulation consists of rigid graphite insulation or graphite felt. Both the rigid insulation and to a lesser extent the graphite felt insulation are somewhat conducting, which adds to the heating losses in case of rf heating. Ideally, these materials should be avoided in the hot zone. Furthermore, the insulation being fairly thick will increase the distance between the graphite to the coil, which reduces the coupling efficiency.

Due to the thermal insulation and the fact that the susceptor is far away from the coil the heat up and specifically cool down takes a very long time, which dramatically reduces the throughput of the reactor. The heat up can be improved by moving the graphite susceptor closer to the coil and by increasing the power. In the ideal case the object that is to be heated should be close to the rf coil and no insulation should be used. This is generally not an acceptable design because of the heat losses and power necessary.

FIG. 2 depicts another prior art reactor section having a cylindrical coil 202 with a susceptor 204. Two half moon shaped shells 206, 208 form a split cylinder. The two half moon shells 206, 208 are separated by two side walls 210, 212, thus forming an interior chamber 214 through which the process gases flow. It is noted that the term "cylinder" as used herein is not limited to a hollow object with a circular cross sectional shape, but includes hollow objects having other cross-sectional shapes.

In any of these arrangements the rf heating into the susceptor will cause hot spots due to arcing between the sides and the top and bottom walls. The arcing will erode the graphite and damage the susceptor. Arcing may be avoided if the side walls are electrically isolated from the top and bottom using e.g. high purity silicon carbide. This, however, can add expense to the reactor design.

With chlorinated chemistry it is possible to grow the epitaxial layers very quickly. The throughput, however, is limited by the heat up, cool down, pump down, and reload times. The heat up can today take about 40 min to 1 hour. Cool down takes 2-3 hours. Pump down and reload times are generally quick and depend much on the system and the person running it. Therefore, there is a need for a system that will allow a very quick heat up and cool down cycle.

SUMMARY OF THE INVENTION

A system for crystal growth is disclosed that may provide heating and cooling times less than commonly used systems. The system is particularly applicable to epitaxial growth. It is contemplated that a system having a 3×4-inch wafer capacity can be heated in 10-20 minutes, and cooled in 20-30 minutes. A fluid-cooling jacket having a reflective shield contained therein is disposed around a heating cylinder in which epitaxial growth takes place. A susceptor apparatus to hold a substrate onto which the crystal is grown is present within the heating cylinder. The heating cylinder has a first end and a second end. A first insulation unit is disposed at the heating cylinder first end and secured thereon, and a second insulation unit is disposed at the heating cylinder second end and secured thereon.

One or more inlets are present through which fluid can be flowed into an area between the inner tube and outer tube, thus surrounding the reflective shield with the fluid. A heating coil is disposed around the outer tube of the fluid jacket.

The reflective shield can aid in quick and efficient heating of the system, however, can increase the time necessary to cool the system. Accordingly, in an illustrative embodiment of the invention, the reflective shield can be moved with respect to the heating cylinder into a position where it will reduce or eliminate the amount of heat reflected back to the susceptor apparatus.

The invention also includes a method of crystal growth wherein the above-described apparatus is used. The apparatus can be equipped with inlets to flow low conductivity gases within the heating cylinder and/or between the fluid jacket and the heating cylinder during heating, and to flow high conductivity gases in those areas during cooling.

DESCRIPTION OF THE DRAWINGS

The invention is best understood from the following detailed description when read with the accompanying drawings.

DETAILED DESCRIPTION OF THE INVENTION

Systems and methods of crystal growth, such as epitaxial growth, are disclosed herein. The disclosed systems and methods may provide faster heating and cooling phases as desired before, during and after crystal growth.

Figure 1:
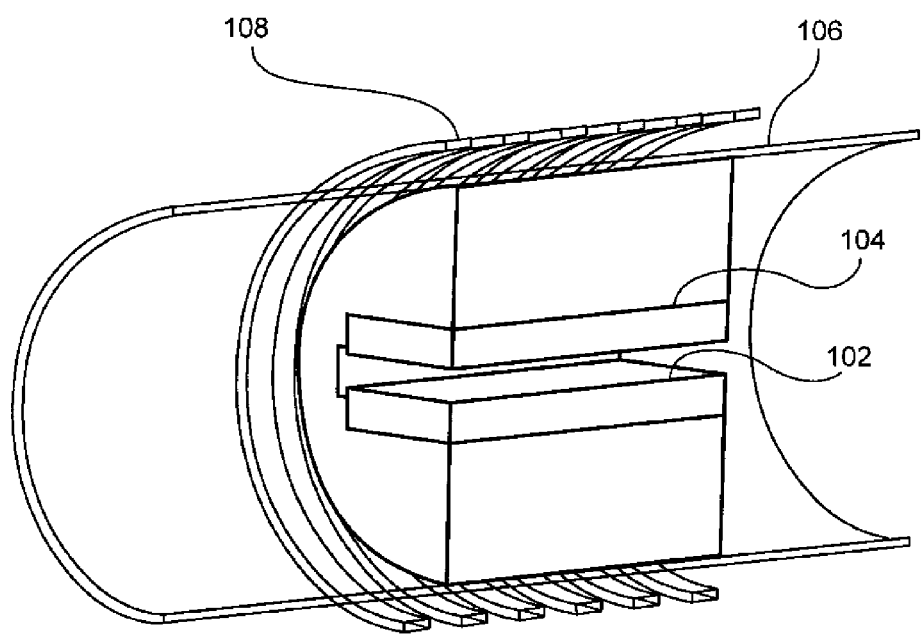
FIG. 1 depicts a prior art susceptor assembly.
Figure 2:
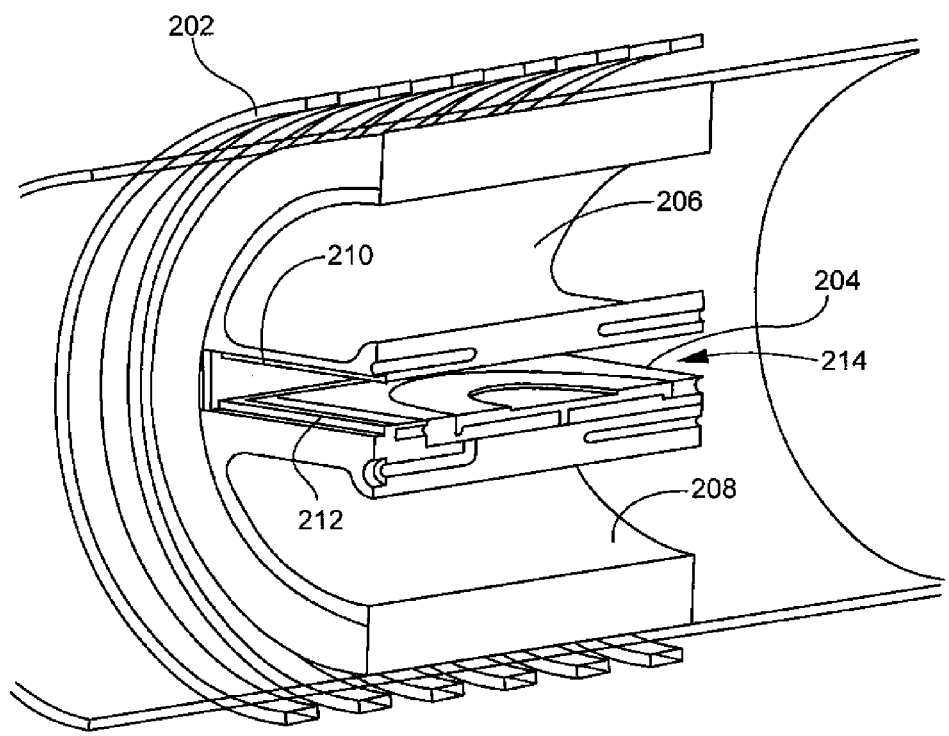
FIG. 2 depicts another prior art susceptor assembly.

A susceptor of the type depicted in FIG. 2 is suitable for use in a quick heating and cooling system because it maintains a uniform and reasonably close distance to the coil. Except for the insulation, as shown in FIG. 2, heat-up and cool-down can be made reasonably fast in this configuration. Without any insulation the radiative losses at 1600° C. are prohibitive. Therefore, some type of insulation is needed. In an illustrative embodiment of the invention, a non-conducting reflective shield is placed in a fluid-cooled jacket. Currently, the most practical fluid to use is water. The reflective shield with jacket is disposed between the coil and heating tube.

Figure 3:
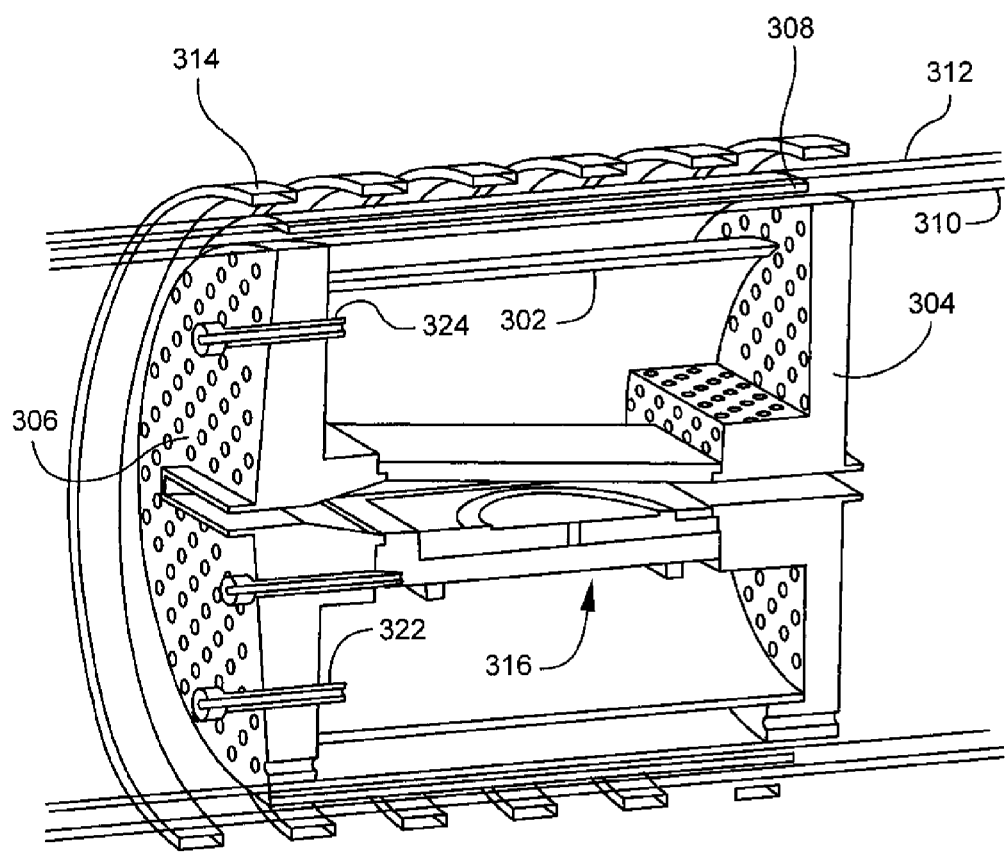
FIG. 3 depicts a susceptor assembly according to an illustrative embodiment of the invention.

FIG. 3 depicts a susceptor assembly with a fluid-cooled jacket according to an illustrative embodiment of the invention. Insulation units 304, 306 are secured to the ends of a susceptor insert 316 in order to achieve a good thermal uniformity. A heating cylinder 302, constructed for example of a metal carbide such as NbC or of graphite (either coated or un-coated), heats susceptor insert 316 through radiation. Exterior to heating cylinder 302 is a fluid jacket for cooling purposes. The fluid jacket comprises an inner tube 310 and an outer tube 312 with a reflective shield 308 disposed therebetween. Reflective shield 308 can be, for instance, a ceramic tube with a reflecting surface. This tube will reflect back the radiation to the cylinder that is heated so that the losses are kept low. Of course, this tube will increase the cool down time. To overcome this problem, the system may incorporate a moveable reflective shield. In this embodiment, the reflective shield is moved away from its position during cool down so that the radiation from the hot cylinder can exit. In an exemplary embodiment of the invention, the movement of the reflective shield can simply be made by changing the fluid flow such that the shield moves from one stop to another.

Inner tube 310 may be formed of quartz for example, or other material that can withstand environmental factors to which it is exposed, such as particular temperatures. Outer tube 312 will, in most instances will be exposed to lower temperatures than outer tube 312, and therefore, may be formed from materials such as quartz or acrylic.

A heating coil 314 is disposed outside of the fluid-cooled jacket. One or more inlets (not shown) are present through which fluid can be flowed into an area between the inner tube and outer tube, thus surrounding the reflective shield with the fluid. The susceptor apparatus holds a substrate onto which epitaxial growth will take place. One or more inlets may also be incorporated into the system to allow fluid, such as argon or hydrogen, to be flowed into an area between the inner tube and the heating cylinder.

In a further illustrative embodiment of the invention one or more inlets 322, 324 are present through which fluid, such as argon or hydrogen, can be flowed into the heating cylinder. The use of argon and hydrogen between the inner tube and heating cylinder and within the heating cylinder will be described below.

Preferably a gap exists between the heating cylinder and the inner tube. In an exemplary embodiment of the invention the gap, as measured perpendicularly from the heating cylinder surface to the inner tube surface, is in the range of about 1 mm to about 50; in a further embodiment of the invention the gap is in the range of about 5 mm to about 15 mm.

A completely circular heating cylinder close to the coil will, from a coupling point of view, be the ultimate choice but not too practical. However, a relatively thin circular tube with an insert through which the gases flow would make a desirable system. The mass will increase through the added tube, however, due to the proximity with the coil, it will be efficiently heated and energy will be efficiently transferred to the insert through radiation (at higher temperatures) and through convection and conduction.

Regardless of what system is used, the use of insulating materials should be minimized for a rapid cool down. Furthermore, with a fluid-cooled jacket the system will cool down quicker as the temperature of the outside surface of the inner tube will be determined by the cooling fluid temperature. Compared to an air cooled system, this can make a major difference since in the air cooled system the outside temperature may be several hundred degrees centigrade. Although the distance between the heating cylinder to the coil increases with the cooling jacket, the net gain in terms of cool down time may still make it beneficial to have the fluid-cooled jacket.

In CVD applications it would be advantageous to use sintered metal carbides, such as NbC, for example, or sintered metal nitrides such as NbN, instead of coated graphite for the heating cylinder and other components. Tantalum carbide (TaC) or TaN may also be used which behaves similar to NbC and NbN, respectively. Zirconium carbide (ZrC), ZrN, HfC, HfN, VC, VN, WC, WN, TiC and TiN may also be used under certain conditions. The sintered objects can generally be used for a longer time and they can furthermore be baked at very high temperatures to remove deposits that may have accumulated on them. The materials selection can also include graphite, or NbC. Graphite is the traditional material, specifically SiC or TaC coated graphite. TaC coated graphite has a very low emissivity and it will reduce the cool-down time. If the surface is rough, the emissivity will improve or if the coating is some other metal carbide (e.g. NbC) the emissivity will also improve.

To speed up this process, HCl and hydrogen can be introduced to aggressively etch off any deposits on the surfaces. This is similar to silicon technology where the graphite is etched with large amounts of HCl in between runs.

On account of the sintered metal carbide's superior electrical conductivity as compared to graphite, components constructed of the material can be made thinner without electromagnetic absorption losses. The advantage of this is two-fold; first the coupling is better and more power is absorbed into the cylinder, and second, the mass of the heating cylinder will become lower, which will reduce the amount of stored energy that needs to be cooled off.

As noted above, it is preferable to have a small gap between the heating cylinder and the inner tube since the inner tube may otherwise melt at high temperatures. To minimize losses during heating, it is preferable to flow argon in this gap on account of argon's low thermal conductivity. Other low thermal conducting gases may also be used. During cool down however, hydrogen or another similar gas with high thermal conductivity should be flowed through this gap.

Preferably the low thermal conductivity gas flow is on during heat-up and growth cycles, however, embodiments of the invention include use of the gas only during heat-up and only during growth. In an illustrative embodiment of the invention, argon or other low thermal conductivity gas is flowed into the system during heating at a rate between about 1 SLM and about 50 SLM. In a further embodiment of the invention the flow rate is between about 3 SLM and about 20 SLM.

Illustrative hydrogen or other high thermal conductivity gas flow rate ranges include about 1 SLM to about 100 SLM and about 3 SLM to about 20 SLM.

As used herein, "low thermal conductivity" refers to values from about 0.01 W/mK to about 0.06 W/mK. An exemplary range is about 0.014 W/mK to about 0.05 W/mK. It is noted that argon, with a value of 0.016 W/mK and nitrogen with a value of 0.024 W/mK fall within these ranges.

As used herein, "high thermal conductivity" refers to values from about 0.18 W/mK to about 0.08 W/mK. An exemplary range is about 0.17 W/mK to about 0.1 W/mK. It is noted that hydrogen and helium, with a value of 0.168 W/mK and 0.142 W/mK, respectively, fall within these ranges.

Similarly, inside the heating cylinder surrounding the susceptor insert, it is preferable to have argon flowing while heating and to change this gas to hydrogen when the system is cooling down. Other low and high thermal conductivity gases can also be substituted for the argon and hydrogen, respectively.

The proposed system is here described in a cylindrical configuration of the heating cylinder. It should be noted that similar arrangements can be made in a rectangular cross section of the heating cylinder or any other shape. Though for simplicity the cylindrical configuration is preferred.

The system has been described for epitaxial growth of SiC. The invention can be equally well be used for any material system where temperatures are high and radiation losses are dominating.

The growth zone is also described as a hot-wall insert inside the heating cylinder. The insert can be made in any manner and may also be as simple as a puck with the gases flowing above it. However, part of the advantage with embodiments of the invention is to separate the process gas flows from the insulating and cooling gas flows which make the hot-wall insert or cassette the most preferable.

The invention also includes a method of epitaxial growth performed in an apparatus of the type described above. A substrate is provided on the susceptor apparatus, onto which an epitaxial layer will be grown. A first fluid, such as water, is flowed through one or more inlets to surround the reflective shield for cooling purposes. The fluid is contained between the inner and outer tubes. A second fluid, such as argon or hydrogen, can be flowed within the heating cylinder to reduce thermal loss. A third fluid, such as argon or hydrogen may be flowed between the heating cylinder and the inner tube, also to reduce thermal loss.

Embodiments of the inventive method further include providing a gap between the heating cylinder and the inner tube. Illustrative gap dimensions are described above.

Embodiments of the inventive method further include the heating cylinder, inner tube and outer tube comprising the materials as described above.

Embodiments of the invention also include semiconductor devices fabricated using the methods, and systems described herein. This includes, for example, a semiconductor device having a silicon carbide or other material layer formed by methods described herein. Semiconductor device types include, but are not limited to, Schottky diode, bipolar diode MOSFET, MESFET, BJT, IGBT, GTO, CMOS, BJT and MEMS devices.

While the invention has been described by illustrative embodiments, additional advantages and modifications will occur to those skilled in the art. Therefore, the invention in its broader aspects is not limited to specific details shown and described herein. Modifications may be made without departing from the spirit and scope of the invention. Accordingly, it is intended that the invention not be limited to the specific illustrative embodiments, but be interpreted within the full spirit and scope of the appended claims and their equivalents.

The invention claimed is:

1. A system for crystal growth comprising:
a heating cylinder having a first end and a second end;
a first insulation unit disposed at the heating cylinder first end and secured thereon;
a second insulation unit disposed at the heating cylinder second end and secured thereon;
a reflective shield disposed around the heating cylinder;
an inner tube disposed between the heating cylinder and the reflective shield;
an outer tube disposed around the reflective shield;
one or more inlets through which fluid can be flowed into an area between the inner tube and outer tube, thus surrounding the reflective shield with the fluid;
a heating coil disposed around the outer tube; and
a susceptor apparatus disposed within the heating cylinder to hold a substrate onto which epitaxial growth will take place.

2. The system of claim 1 further comprising one or more inlets through which fluid can be flowed into an area between the inner tube and the heating cylinder.

3. The system of claim 1 further comprising one or more inlets through which fluid can be flowed into the heating cylinder.

4. The system of claim 1 comprising a gap between the heating cylinder and the inner tube in the range of about 1 mm to about 50 mm.

5. The system of claim 4 wherein the gap is in the range of about 5 mm to about 15 mm.

6. The system of claim 1 wherein the heating cylinder comprises a metal carbide.

7. The system of claim 1 wherein the outer tube is acrylic.

* * * * *